United States Patent
Siessegger et al.

(10) Patent No.: US 9,374,015 B2
(45) Date of Patent: Jun. 21, 2016

(54) LIGHTING DRIVER HAVING MULTIPLE DIMMING INTERFACES

(71) Applicant: OSRAM SYLVANIA Inc., Danvers, MA (US)

(72) Inventors: Bernhard Siessegger, Danvers, MA (US); Christian Breuer, Newburyport, MA (US); Avinash Gunda, Danville, NH (US)

( * ) Notice: Subject to any disclaimer, the term of this patent is extended or adjusted under 35 U.S.C. 154(b) by 0 days.

(21) Appl. No.: 14/373,095

(22) PCT Filed: Jan. 21, 2013

(86) PCT No.: PCT/US2013/022362
§ 371 (c)(1),
(2) Date: Jul. 18, 2014

(87) PCT Pub. No.: WO2013/110024
PCT Pub. Date: Jul. 25, 2013

(65) Prior Publication Data
US 2014/0354178 A1    Dec. 4, 2014

Related U.S. Application Data

(60) Provisional application No. 61/588,838, filed on Jan. 20, 2012.

(51) Int. Cl.
*H05B 33/08* (2006.01)
*H05B 37/02* (2006.01)
(Continued)

(52) U.S. Cl.
CPC .............. *H02M 7/06* (2013.01); *H01L 25/167* (2013.01); *H01L 27/156* (2013.01); *H01L 33/62* (2013.01);
(Continued)

(58) Field of Classification Search
CPC .......... H05B 33/0845; H05B 33/0803; H01L 25/167; H01L 27/156; H01L 33/62
USPC ......................................................... 315/294
See application file for complete search history.

(56) References Cited

U.S. PATENT DOCUMENTS

| | | | | |
|---|---|---|---|---|
| 2009/0184662 A1* | 7/2009 | Given | ................ | H05B 33/0815 315/294 |
| 2011/0140611 A1* | 6/2011 | Elek | .................... | H05B 37/0272 315/130 |
| 2012/0133298 A1* | 5/2012 | Campbell | .......... | H05B 33/0833 315/250 |

FOREIGN PATENT DOCUMENTS

| | | | | |
|---|---|---|---|---|
| WO | WO 2012/009622 | * | 1/2012 | ......... H05B 33/0854 |
| WO | WO2012/009622 A2 | | 1/2012 | |

OTHER PUBLICATIONS

PCT Search Report, dated Apr. 30, 2013.

*Primary Examiner* — Dylan White
(74) *Attorney, Agent, or Firm* — Andrew Martin (57) ABSTRACT

Lighting control techniques and corresponding drivers and ballasts are disclosed. In some embodiments, the driver or ballast receives multiple dimming inputs and has multiple dimming interfaces that produce initial dimming signals or levels. The initial dimming signals are manipulated by a controller to produce a final output dimming signal or level that is based on the dimming signals received and dims the attached light sources accordingly. The manipulations performed by the controller may include various operations, such as comparisons and calculating the product of the initial dimming signals. In some embodiments, the techniques can be applied to light-emitting diode (LED) drivers or ballasts for fluorescent and other discharge light sources and can be used in smart grid and peak power shaping applications.

18 Claims, 8 Drawing Sheets

(51) Int. Cl.
  *H02M 7/06* (2006.01)
  *H05B 41/39* (2006.01)
  *H01L 25/16* (2006.01)
  *H01L 27/15* (2006.01)
  *H01L 33/62* (2010.01)
  *H01L 25/075* (2006.01)
  *G01R 31/26* (2014.01)
  *G01R 31/40* (2014.01)
  *G01R 31/44* (2006.01)
  *G01R 31/02* (2006.01)

(52) U.S. Cl.
  CPC .......... *H05B 33/0803* (2013.01); *H05B 33/083* (2013.01); *H05B 33/086* (2013.01); *H05B 33/0806* (2013.01); *H05B 33/0812* (2013.01); *H05B 33/0815* (2013.01); *H05B 33/0821* (2013.01); *H05B 33/0827* (2013.01); *H05B 33/0845* (2013.01); *H05B 33/0848* (2013.01); *H05B 33/0851* (2013.01); *H05B 33/0884* (2013.01); *H05B 33/0893* (2013.01); *H05B 37/02* (2013.01); *H05B 37/0209* (2013.01); *H05B 41/39* (2013.01); *G01R 31/028* (2013.01); *G01R 31/2633* (2013.01); *G01R 31/2635* (2013.01); *G01R 31/40* (2013.01); *G01R 31/44* (2013.01); *H01L 25/0753* (2013.01); *H01L 2224/48091* (2013.01); *H01L 2224/48227* (2013.01); *H01L 2224/48247* (2013.01); *H01L 2924/12032* (2013.01); *H01L 2924/12044* (2013.01); *H01L 2924/1301* (2013.01); *H01L 2924/1305* (2013.01); *H01L 2924/13033* (2013.01); *H01L 2924/13091* (2013.01); *Y02B 20/343* (2013.01); *Y02B 20/345* (2013.01); *Y02B 20/346* (2013.01); *Y02B 20/347* (2013.01); *Y10T 307/615* (2015.04)

0-10V at 50% (Phase Cut disabled)
=> Output at 50%

Phase Cut at 75% (0-10V disabled)
=> Output at 75%

MIN(0-10V at 50%, Phase Cut at 75%)
=> Output at 50%

(0-10V at 50%) x (Phase Cut at 75%)
=> Output at 37.5%

201 = 0-10V Dimming Interface Signal (to Controller)
202 = Phase Cut Dimming Interface Signal (to Controller)
203 = PWM Dimming Control Output Signal (from Controller)

LIGHTING DRIVER HAVING MULTIPLE DIMMING INTERFACES

CROSS-REFERENCE TO RELATED APPLICATIONS

This application is a U.S. National Stage application of, and claims the benefit of, International Application PCT PCT/US2013/022362, filed Jan. 21, 2013, which claims the benefit of Provisional Application No. 61/588,838 filed Jan. 20, 2012. Each of these applications is herein incorporated by reference in its entirety.

FIELD OF THE DISCLOSURE

The present application relates to lighting technology, and more particularly, to lighting drivers and ballasts having multiple dimming interfaces.

BACKGROUND

Powering light sources within a lighting system involves a number of non-trivial issues, particularly with respect to the driver/ballast component of a lighting system, such as designing cost-effective drivers/ballasts without sacrificing desired functionality or performance.

DETAILED DESCRIPTION

Lighting control techniques and corresponding drivers and ballasts are disclosed. In some embodiments, the driver or ballast receives multiple dimming inputs and has multiple dimming interfaces that produce initial dimming signals or levels. The initial dimming signals are manipulated by a controller to produce a final output dimming signal or level that is based on the dimming signals received and dims the attached light sources accordingly. The manipulations performed by the controller may include various operations, such as comparisons and calculating the product of the initial dimming signals, in some embodiments. In some such cases, the dimming behavior is configurable as the end-user of the space being illuminated can select between different dimming modes (e.g., based on multiplication, or overall minimum). The techniques can be applied, for example, to light-emitting diode (LED) drivers or ballasts for fluorescent light sources and high-intensity discharge (HID) and other types of gas-discharge light sources, and can be used in smart grid and peak power shaping applications. Although some specific example embodiments provided herein operate in the context of LED lighting systems, the techniques may be readily applied or otherwise used for other applications, such as for HID and gas-discharge light sources and their respective ballasts, as will be appreciated in light of this disclosure. Numerous configurations and variations will be apparent in light of this disclosure.

General Overview

As previously explained, there are a number of non-trivial issues associated with powering light sources within a lighting system. The design of one particular component of a lighting system—the driver or ballast—has become increasingly important. LED drivers are generally used to provide the proper power supplies for LED systems. Ballasts perform similar operations, providing the proper power supplies for HID and other types of gas-discharge (such as fluorescent) lighting systems. Drivers and ballasts may also perform a number of additional functions, including power factor correction and voltage isolation, e.g., to protect LEDs from line-voltage fluctuations, and can provide other functionality to the lighting system to facilitate advanced user control. One particular function that drivers and ballasts provide or facilitate is dimming the lighting system. Drivers with dimming capability (also known as dimming drivers) can dim the LED light output over a full range from 100% (no dimming, brightest setting) to 0% (full dimming, darkest setting). Some dimming devices and lighting systems use varied standards and/or interfaces. For instance, some currently available fluorescent ballasts have two dimming interfaces: a 0-10V dimming interface and a phase cut dimming interface. Each of the two dimming interfaces provides a dimming level, and the output power of the ballast is controlled by the one of the two dimming levels which provides lower output power. Other lighting control systems offer highly sophisticated dimming controls. Such systems typically come as stand-alone systems, and hence are not part of a driver and therefore require a more skilled person for installation.

Thus, and in accordance with one or more embodiments of the present invention, lighting control techniques and devices are disclosed herein that allow for multiple interface types and further allow for end-user configurability. The interface types may include, for example, a 0-10V dimming interface and a phase cut dimming interface, although any number of other interface types can be used (e.g., DALI, or proprietary, etc.). The term "dimming level" is used herein to describe the dimming signal at various stages of the lighting system, thus the terms "dimming level" and "dimming signal" are understood to be interchangeable. As will be further appreciated, the term "driver" may be used herein to mean, for instance, an LED driver or fluorescent ballast or any other ballast to operate other types of gas discharge lighting devices. The term "LED" as used herein includes inorganic light emitting diodes (sometimes also referred to as LEDs) and organic light emitting diodes (sometimes referred to as OLEDs). The signals discussed herein may be analog or digital depending on the particular implementation used. The dimming levels produced by the dimming devices are listed throughout the disclosure herein as a percentage of the maximum output, i.e., 100% dimming level is the maximum or total output (brightest configuration) and 0% dimming level is the minimum or zero output (darkest configuration). For example, if the dimming device dims by 30%, the final dimming signal or level would be at 70%.

Dimming Control Methodology

Figure 1:
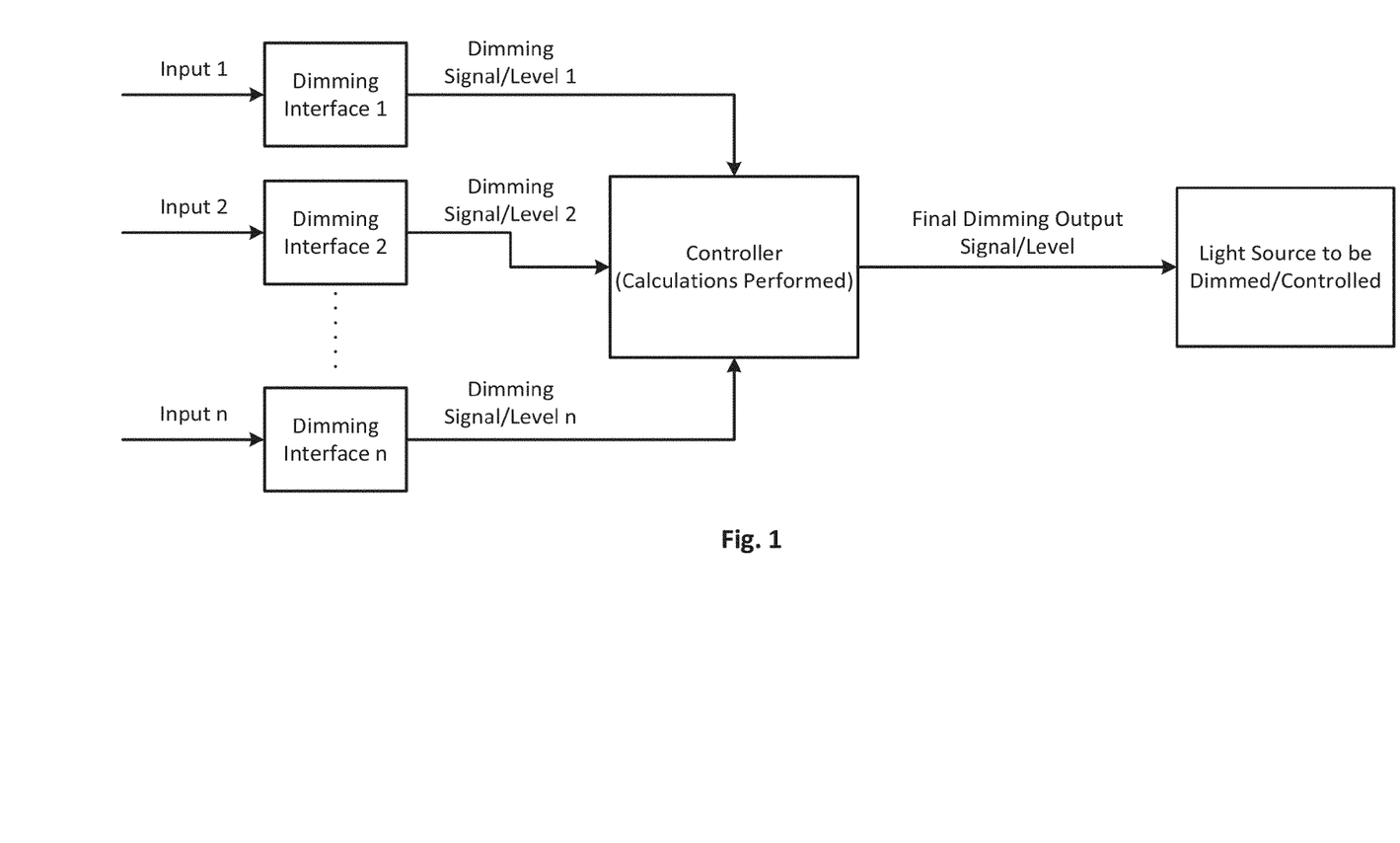
FIG. 1 is a general block diagram of a lighting system configured in accordance with an embodiment of the present invention having n dimming interfaces.

FIG. 1 is a general block diagram of a multi-interface lighting system configured in accordance with an embodiment of the present invention. The multiple interfaces (Interface 1, Interface 2, . . . Interface n) receive an input (Input 1, Input 2, . . . Input n), such as an input power, input voltage or current, control signal, or some other dimming input signal based on the protocol involved. Each dimming interface sends at least one initial dimming signal or level (Dimming Signal/Level 1, Dimming Signal/Level 2, . . . Dimming Signal/Level n) to a device configured to receive the n dimming signals/levels and to manipulate those signals through calculations, mathematical operations, and comparisons, as described herein. A single dimming interface may output more than one initial dimming signal or level, e.g., a digital interface (such as DALI) may output three or more dimming signals. The central device, shown as and referred to herein as "Controller," may be implemented, for example, with a microcontroller, processor, or microprocessor that includes or is otherwise operatively coupled with a switching matrix, and is programmed or otherwise configured to interpret and/or manipulate the various dimming signals received.

The terms "manipulating/manipulate/manipulation" as used herein in the context of a Controller manipulating one or more of the initial dimming signals or other received inputs, can be understood to include, for instance: comparing (e.g., to produce the overall minimum/maximum signal from the dimming signals received), performing various calculations (e.g., multiplying the dimming signals to produce the product, taking the average of all of the dimming signals, adding the dimming signals), storing, recording, filtering, merging, splitting, amplifying, isolating, identifying, and/or any combination of these and other operations. The Controller produces a Final Dimming Output Signal/Level based on its configuration or programming, as is shown in FIG. 1. This Final Dimming Output Signal/Level is received by the Light Source to be Dimmed/Controlled, resulting in the lights of the lighting system being dimmed or controlled accordingly. In some embodiments, intermediate operations and/or devices may be added to the lighting system shown in FIG. 1 (e.g., correction blocks/circuitry, conversion devices/circuitry, etc.). As will be further appreciated, the various modules and functions described herein may be provided in a discrete fashion as shown (where the dimming interfaces are distinct from the Controller, as is the light source to be controlled), but may also be integrated as desired such as example embodiments where each of the dimming interfaces and/or light source is integrated into the Controller.

There are numerous different dimming modes that may be used when integrating or otherwise using multiple dimming interfaces with a single lighting driver, such as non-dimming, overall-minimum, overall-maximum, multiplication-based, and selective-control, in accordance with an embodiment of the present invention. The non-dimming mode is when no dimming interfaces or dimming devices are enabled or used, as though the lighting system is merely connected to at least one simple on-off light switch. This allows embodiments of the present invention to be utilized in lighting systems without dimming functions. The overall-minimum dimming mode results in the output signal being controlled by the minimum value of all of the dimming levels. The overall-maximum dimming mode results in the output signal being controlled by the maximum value of all of the dimming levels. The multiplication-based dimming mode results in the output signal being proportional to the product of all of the dimming levels. The selective-control dimming modes result in the output signal being directly driven by one of the selected dimming levels available from the dimming interfaces. The selective-control mode may be automatically activated when only one dimming device or interface is enabled (or when one or more dimming devices or interfaces are disabled) or programmed to set the driver to this configuration when the use of only one dimming device or interface is desired (or when the use of one or more dimming devices or interfaces is not desired). These dimming modes are provided as examples and may also be thought of as single calculations or operations that the Controller performs. They may be combined or include other operations to provide other methods of producing a final output signal that drives the attached light source(s), as will be apparent in light of this disclosure.

Figure 2:
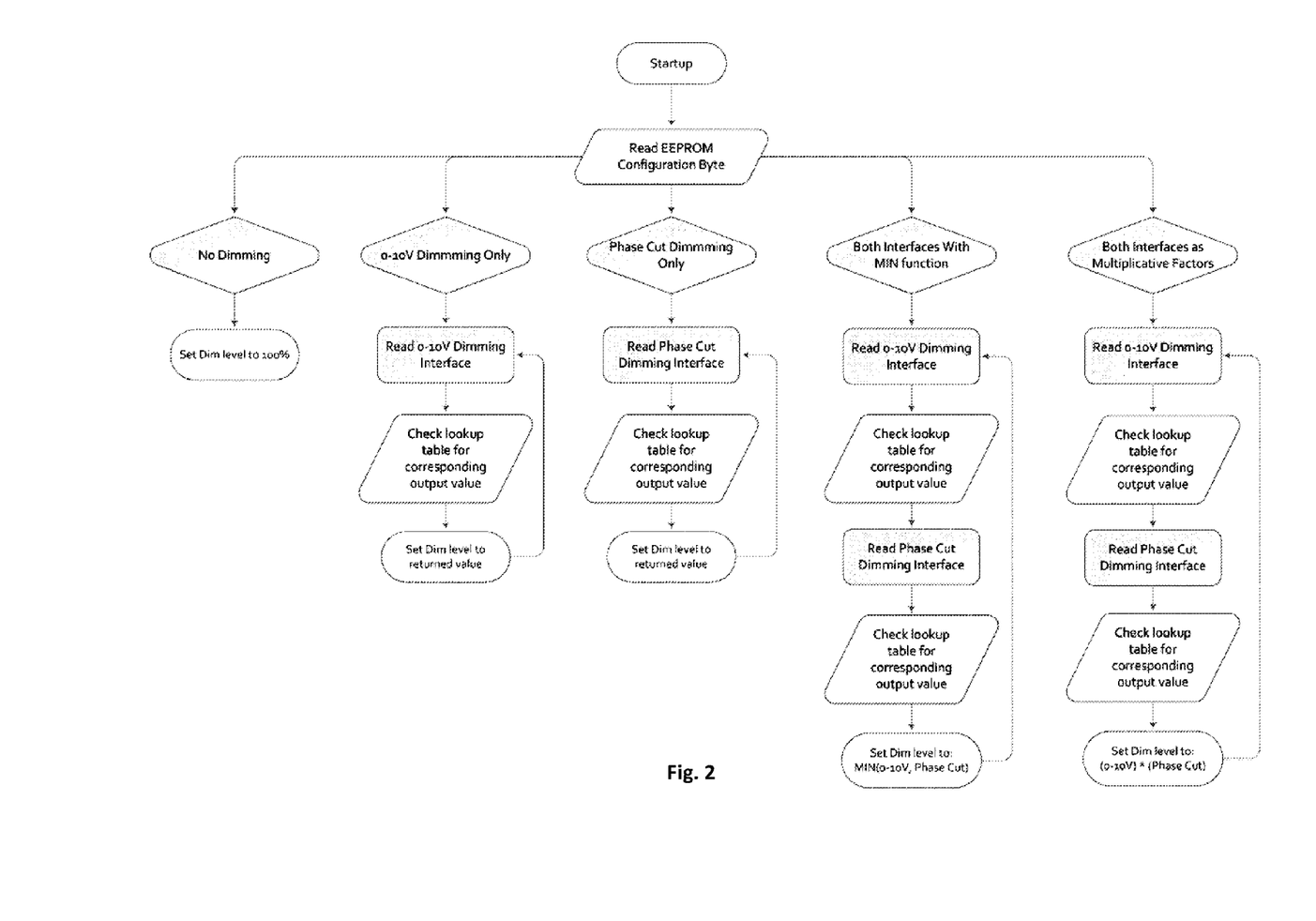
FIG. 2 is a flow chart illustrating various example dimming scenarios that can be executed by the lighting system of FIG. 1, in accordance with an embodiment of the present invention.

FIG. 2 is a flow chart illustrating various example dimming scenarios that can be executed by the lighting system of FIG. 1, in accordance with an embodiment of the present invention. The system in this example embodiment has two dimming interfaces—a 0-10V dimming interface and a phase cut dimming interface. This embodiment further has five different dimming modes: non-dimming, selective-control 1 (only the 0-10V dimming interface is enabled), selective-control 2 (only the phase cut dimming interface is enabled), overall-minimum, and multiplication-based. The Controller outputs a pulse width modulation (PWM) based dimming output signal, in accordance with some embodiments.

As the example embodiment of FIG. 2 further illustrates, after Startup (when the Controller is turned on or receives power), non-volatile memory is read to determine the dimming mode. In this example, the non-volatile memory is electrically erasable programmable read-only memory (EEPROM), although any suitable memory can be used (e.g., FLASH memory or battery-buffered RAM). In this embodiment, the EEPROM configuration byte is read to determine which of the five dimming modes has been selected (e.g., by end-user or automatically by system). The first or far left branch represents an example technique for the non-dimming mode or no dimming configuration, which sets the dimming or dim level at 100%. This may also be the result where no dimming devices are connected to the lighting system and/or no dimming interfaces are enabled.

Figure 3A:
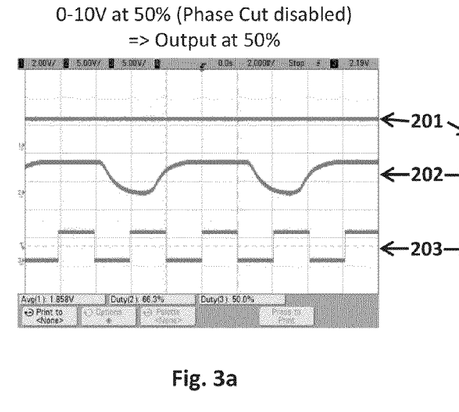
FIGS. 3a-d illustrate example input signals and the corresponding output signals for the example dimming scenarios illustrated in FIG. 2, in accordance with an embodiment of the present invention.

The next branch of FIG. 2 illustrates a technique for the selective-control dimming mode or configuration using a 0-10V dimming interface only (the phase cut dimming device/interface is disabled). In this configuration, the 0-10V dimming interface is continually read while the lighting driver is on and the corresponding output value is taken from the lookup table (or otherwise derived from the dimming interface signal) to set the dim level to the proper returned value. For example, as shown in FIG. 3a, in the selective-control dimming mode (with the phase cut dimming device/interface disabled), the 0-10V dimming interface signal 201 is set at 50% (e.g., via a wallbox dimmer device). This signal 201 is sent to the Controller, which outputs a PWM dimming control output signal 203, resulting in a dim level of 50%. Since the phase cut dimming device or interface is disabled (or not selected), the phase cut dimming interface signal 202 does not affect the output in this configuration.

Figure 3B:
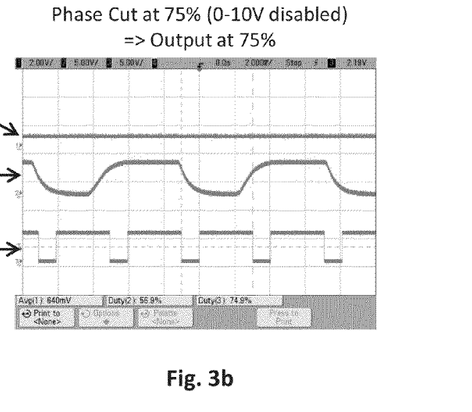

The middle branch of FIG. 2 illustrates a similar technique as that in the preceding paragraph, except that the selective-control dimming mode or configuration uses the phase cut dimming interface only (the 0-10V dimming device/interface is disabled). In this configuration, the phase cut dimming interface is continually read while the lighting driver is on and the corresponding output value is taken from the lookup table (or otherwise derived from the dimming interface signal) to set the dim level to the proper returned value. For example, as shown in FIG. 3b, in the selective-control dimming mode (with the 0-10V dimming device/interface disabled), the phase cut dimming interface signal 202 is set at 75%. This signal 202 is sent to the Controller, which outputs a PWM dimming control output signal 203 resulting in a dim level of 75%. Since the 0-10V dimming device or interface is disabled (or not selected), the 0-10V dimming interface signal 201 does not affect the output in this configuration.

Figure 3C:
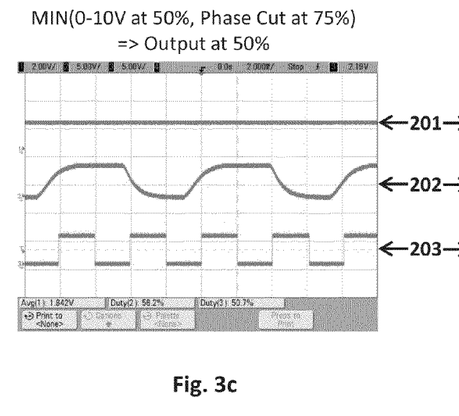

The next or fourth branch of FIG. 2 illustrates a technique for the overall-minimum dimming mode or configuration for this embodiment. This configuration uses both the 0-10V dimming interface and the phase cut dimming interface, continually reading them while the lighting driver is on and returning the corresponding output value taken from the lookup table (or otherwise derived from the dimming interface signals). The final output signal or dim level is then set at the overall-minimum value of all the interfaces, i.e., in this embodiment, the lower of the two values returned from the interfaces. For example, as shown in FIG. 3c, the 0-10V dimming interface signal 201 is set at 50% and the phase cut dimming interface signal 202 is set at 75%. These signals 201, 202 are assessed by the Controller, which outputs the PWM dimming control output signal 203 at the proper dim level. In this instance, since the dimming mode is overall-minimum (i.e., the Controller manipulates the two initial dimming signals by comparing them and taking the lower value), the lesser of the resultant values—50% and 75%—is taken, so the resulting final output signal or dim level is 50%.

Figure 3D:
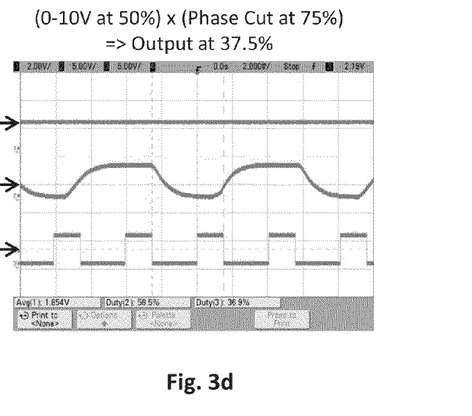

The far right branch of FIG. 2 illustrates a technique for the multiplication-based dimming mode or configuration for this embodiment. This configuration uses both the 0-10V dimming interface and the phase cut dimming interface, continually reading them while the lighting driver is on and returning the corresponding output value taken from the lookup table (or otherwise derived from the dimming interface signals). The final output signal or dim level is then set at the product of the dim levels from all of the interfaces, i.e., in this embodiment, the product of the two returned dim levels. For example, as shown in FIG. 3d, the 0-10V dimming interface signal 201 is set at 50% and the phase cut dimming interface signal 202 is set at 75%. These signals 201, 202 are assessed by the Controller, which outputs the PWM dimming control output signal 203 at the proper dim level. In this instance, since the dimming mode is multiplication-based (i.e., the Controller manipulates the two initial dimming signals by multiplying them and outputting the product), the product of the resultant values—50% and 75%—is taken, so the resulting final output signal or dim level is 37.5%.

Some embodiments of the present invention enable the presetting of a maximum output level for an end-user. For example, using an example embodiment discussed with reference to FIGS. 1, 2, and 3a-d, assume one of the two dimming interfaces may be controlled by an overall control system separate from the end-user. This enables the overall control system, which is separate from the end-user, to set the maximum brightness level when the system is in the overall-minimum dimming mode, thereby setting a maximum output level for the system. For example, in a situation where one dimming interface is controlled by a landlord/building manager and the other by the end-user tenant, if the building manager's dimming interface (e.g., a phase cut dimming interface) is set at 90%, then this would be the maximum output level that the tenant's lighting system can achieve in the overall-minimum dimming configuration. Therefore, even if the dimming interface controlled by the tenant (e.g., a 0-10V dimmer) is set at 100%, the output signal remains at 90%. However, when the dimming interface controlled by the tenant is switched to reduce the dim level below 90%, then that dimming interface controls as the overall-minimum value.

This dimming mode may be applied in numerous other situations, such as in parental-control applications, where parents use their dimming interface to set a maximum output level (e.g., 100% during the daytime, but only 30% at nighttime because it is darker outside and the child is getting ready for sleep) or in commercial settings, such as restaurants, where one of the dimming interfaces is connected to a timer that adjusts the maximum output level at a certain time of day (e.g., 80% between 7 p.m. and 10 p.m., and 15% between 10 p.m. and 7 a.m.), allowing flexibility below that maximum output level through the control of the second dimming interface.

Other embodiments of the present invention focus on use of the driver's multiplication-based dimming mode. This example configuration may be used to enable the setting of one or more reduction factors that decrease the final output signal or dim level of the lighting system. For example, using an example embodiment discussed with reference to in FIGS. 1, 2, and 3a-d, assume one of the two dimming interfaces may be controlled by an overall control system separate from the end-user. This results in the output signal of the overall control system dimming interface being multiplied by the output signal of the end user's dimming interface, resulting in the overall control system acting as a reduction factor when it is set at any value less than 100%. Many lighting systems are powered by dedicated lighting branches, which may simplify the implementation of the multiplication-based dimming system.

Thus, an application may enable an overall building management system (BMS) to control a dimming interface (e.g., a phase cut dimming interface) that is placed subsequent to the circuit breaker that feeds the dedicated lighting branch. Such a setup enables, e.g., a utility company to communicate to the BMS at times of high power demand to reduce all lighting output by a factor of 10% (i.e., to set the phase cut dimming interface at 90% output signal or dim level). Therefore, when an end-user sets its dimming interface (e.g., a 0-10V dimmer) at, e.g., 80%, the actual final output signal or dim level is 72% (80%*90%). Such an embodiment may be useful in a so-called smart grid application or peak power shaping application because it reduces cost by lowering the overall electricity usage during peak times when electricity is the most expensive per unit. In some instances, the changes in lighting may be implemented over a period of time (e.g., ten minutes) to reduce the disturbance that the dimming causes to occupants of the illuminated space. For example, continuing with the previous application, the BMS can be configured to continuously change the dimming level at a very slow rate of change such that when the 10% reduction factor is applied and subsequently removed, it would be virtually unnoticed by most occupants.

Figure 4:
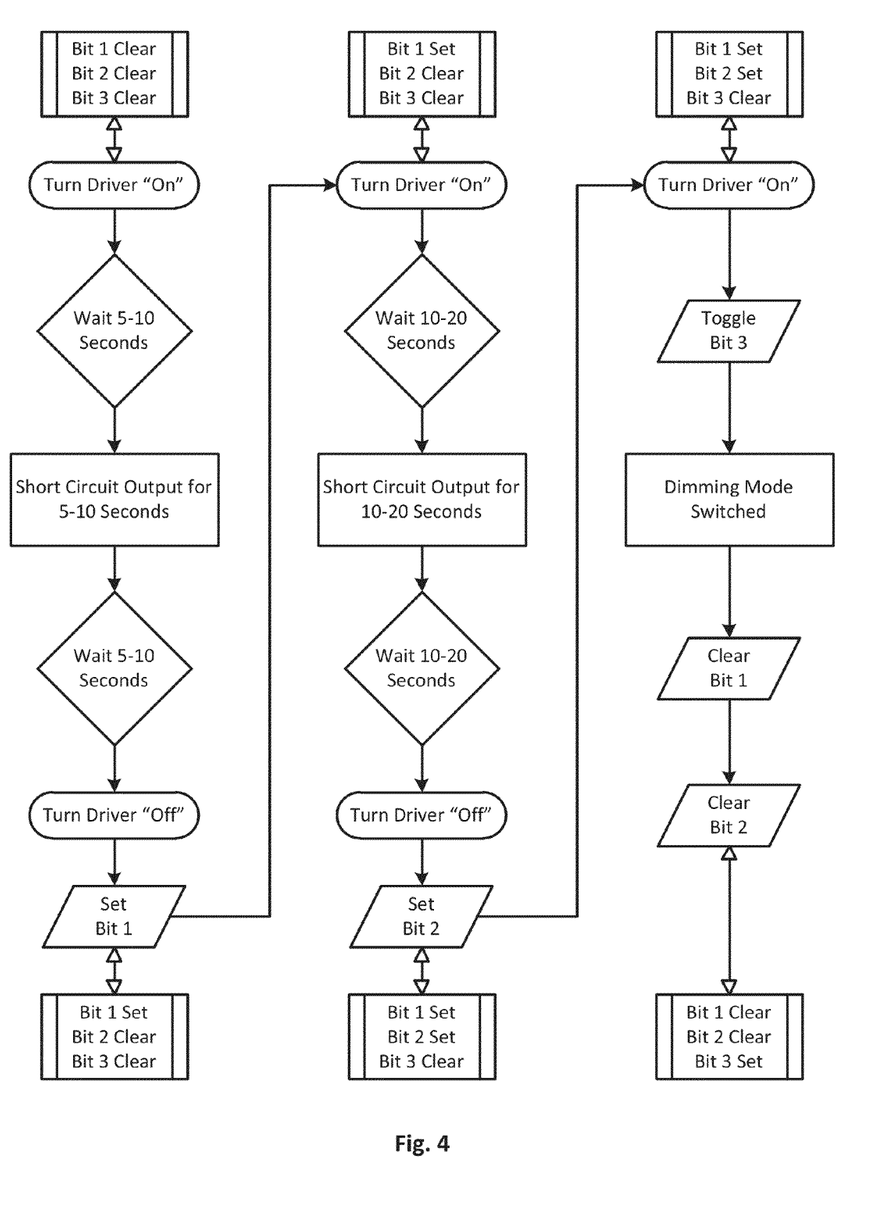
FIG. 4 is a flow chart illustrating an example sequence for toggling dimming modes in accordance with an embodiment of the present invention.

In one or more embodiments, the system is user configurable to allow for selection of the different dimming modes provided. In some such embodiments, the driver of the system may be toggled from one mode to another using a predefined sequence of events or program, typically a sequence or program that is unlikely to occur during ordinary operation of the lighting system. The active mode can be indicated, for example, in a register or other storage element inside the driver. For example, FIG. 4 is a flow chart illustrating an example sequence for toggling the dimming modes in accordance with an embodiment of the present invention. This particular example embodiment is configured to have two different simple dimming modes: 1) an overall-minimum dimming mode and 2) a multiplication-based dimming mode. In this example, a single bit in non-volatile memory (e.g., bit 3) is used to determine/code/select the dimming mode. The driver of this example starts in its preset or default mode (e.g., which is set during the production of the driver) with bit 3 cleared. For purposes of illustration, the preset mode with bit 3 cleared in this example is an overall-minimum mode.

The driver will stay in the overall-minimum mode unless both bits 1 and 2 are set in a specific sequence, which triggers bit 3 to be toggled. As previously explained, in overall-minimum mode, the final dimming output signal is proportional to the lowest value of all of the initial dimming signals. Bit 1 is set by the following sequence illustrated in the left column of FIG. 4: 1) the driver is powered on, 2) 5-10 seconds elapse, 3) the output is short circuited for 5-10 seconds, 4) 5-10 seconds elapse, and 5) the driver is powered off. If any of these conditions is not met—e.g., the output is shorted for 15 seconds—then bit 1 will not be set. Bit 2 is set by the following sequence illustrated in the middle column of FIG. 4: 1) the driver is powered on, 2) 10-20 seconds elapse, 3) the output is short circuited for 10-20 seconds, 4) 10-20 seconds elapse, 5) the driver is powered off. If the sequence to set bit 2 is not performed after setting bit 1, then bit 1 will clear and the user will have to start from the beginning But if both bits are properly set at start-up, then bit 3 is toggled and bits 1 and 2 are cleared as shown in the right column of FIG. 4. When bit 3 is toggled, the driver dimming mode is switched. In this driver embodiment, the switch is made to a multiplication-based dimming mode (with bit 3 set). As previously explained, in this mode, the final dimming output signal is the product of all of the initial dimming signals. To switch back to the overall-minimum mode, the same sequence from above is performed, which will toggle bit 3 back to the overall-minimum configuration (with bit 3 clear).

The sequence of the preceding paragraph is provided as one example; however, numerous other sequences or programs may be used to change the way the Controller manipulates the applied dimming signals. Since there are only 3 bits used in the above example sequence, only 3 bits of non-volatile memory (e.g., EEPROM) are consumed in total for implementing the switching feature. In some embodiments, more complex configurations and programming sequences may require additional or different computer memory to switch the dimming modes, including the use of other types of memory. In other embodiments, the switching of the Controller's configuration may be facilitated by additional devices, such as a physical switch or and/or a graphical user interface by which the user can access and configure the Controller and/or a digital dimming interface (e.g., a DALI). In embodiments using a digital dimming interface, the switching of the Controller's configuration can be performed in many different ways. For example, using a digital dimming interface may allow the controller to be configured by the following: the end-user, the installer (e.g., while commissioning the lighting system at the time of installation), the building owner, or the building management system (e.g., using a fully-automated procedure that requires no actual operator). In some embodiments, the switching of the dimming modes may be automatic through, e.g., detection of whether dimming devices are connected to the dimming interfaces or the overall driver. For instance, in situations where interfaces are not connected to a dimming device, they can be selectively disabled and the remaining enabled interfaces are then utilized in, e.g., a multiplication-based dimming mode (this dimming configuration combines both the selective-control and the multiplication-based dimming modes).

In some embodiments, the lighting control techniques provided herein are achieved without a dedicated lighting control component in the lighting system. Cost and size/space requirements may be reduced in the lighting system by integrating various light controls into the lighting driver. The reductions can be achieved without sacrificing functionality, because the drivers can be made configurable to different dimming modes and provide flexibility through multiple interfaces as explained herein. In some applications of embodiments of the present invention, the end-user can set the light level according to personal preferences and/or utilize other control systems, e.g., light sensors or building management systems, without the need for additional light management systems. Detailed embodiments of the present invention are now explained through disclosure of their driver architecture to further illustrate the concepts and devices described herein. These specific driver architectures are provided as examples and the claimed invention is not intended to be limited to these examples.

Driver Architecture Examples

Figure 5:
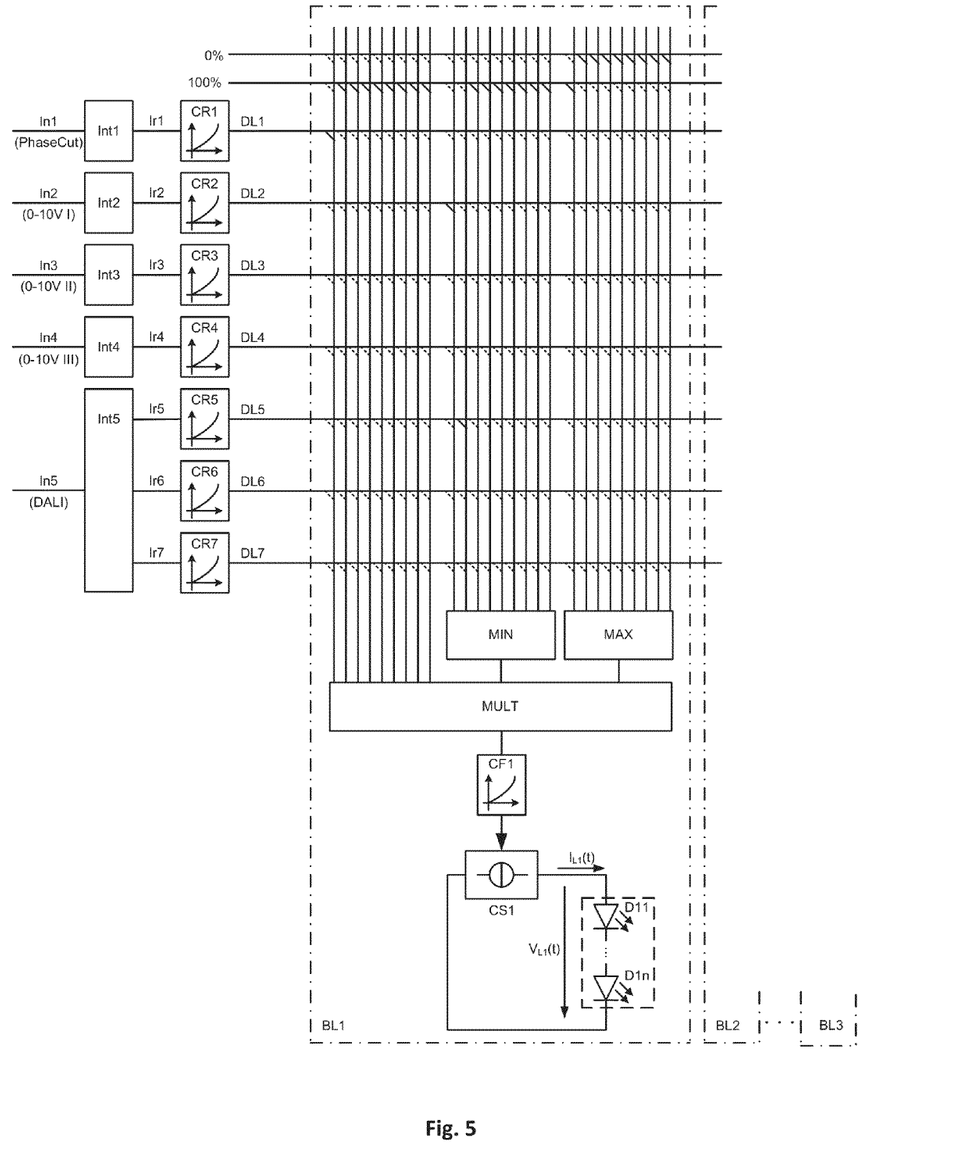
FIG. 5 is a detailed block diagram of a lighting system configured in accordance with an embodiment of the present invention.

FIG. 5 is a detailed block diagram of a lighting system configured in accordance with an embodiment of the present invention. As can be seen, this example system includes a 3-channel driver having multiple dimming interfaces. Each of the three channels BL1 through BL3 is supplying power to an LED string. The dimming interfaces are shown as Int1-Int5, where Int1 is a phase cut dimming interface, Int2-Int4 are 0-10V dimming interfaces, and Int5 is a DALI dimming interface. Each interface receives a respective input signal In1-In5 (e.g., Int1 receives In1, etc.). After receiving the respective inputs In1-In5, the interfaces Int1-Int5 output rough dimming levels (Ir). In this example embodiment, the phase cut dimming interface Int1 and 0-10V dimming interfaces Int2-Int4 each output one rough dimming level Ir1-Ir4, respectively. The DALI dimming interface Int5 in this example embodiment outputs three rough dimming levels or signals Ir5-Ir7. As is known with the use of DALI, the three signals may be used for various applications, such as assigning one of Ir5-Ir7 to an address, command, and data signal to send a vast number of different commands to a device using the same structure. The rough dimming levels Ir1-Ir7 are each fed through corresponding correction blocks CR1-CR7, which may alleviate static (and potentially dynamic) distortions and may also normalize all of the rough dimming levels Ir1-Ir7, so that the final dimming levels DL1-DL7, sometimes referred to herein as initial dimming levels or signals, become linear or logarithmic (or the desired signal shape). In other embodiments, the rough dimming levels Ir1-Ir7 may be considered the initial dimming signals, since the correction blocks or other circuitry required to normalize all of the initial dimming signals may be integrated into the controller. The normalization ensures that the controller is manipulating similar control signal types, e.g., the normalized dimming levels DL1-DL7.

The dimming levels DL1-DL7 are fed into a controller, which in this particular embodiment includes a programmable switching matrix and a microcontroller programmed or otherwise configured with MIN, MAX, and MULT functions. Note that the correction blocks CR1-CR7 as well as the final correction block CF1 may also be programmed or otherwise configured into the microcontroller. For the programmable switching matrix of this specific example embodiment to operate properly, exactly one switch needs to be closed in each column of the matrix, whereas all of the other switches have to be open. This restriction ensures that all of the operation blocks (MIN, MAX, MULT) receive a proper signal or level. This signal may be analog or digital depending on the particular implementation used. The operation blocks of the microcontroller provide: 1) MIN—the minimum value of the received signals; 2) MAX—the maximum value of the received signals; and 3) MULT—the product of all of the received signals. However, any desired combination and/or configuration of computation blocks may be used in other embodiments. After the mathematical operations are performed by the three blocks, the final output dimming signal is sent to the final correction block CF1, which controls the final current source CS1. This current source CS1 drives the first LED string D11-D1n connected to the driver (where n represents the number of LEDs on the D1 LED string). Because this is a 3-channel driver, there are sections BL2 and BL3 similar to section BL1 for the other two channels of the driver. The use of multiple-channel drivers provides even more flexibility when configuring the lighting system setup.

In this example embodiment, the matrix is setup with DL1 feeding into the MULT block (else non-influencing 100% values are fed into the block), DL2 and DL5 feeding into the MIN block (else non-influencing 100% values are fed into the block), and a 100% value feeding into the MAX block (else non-influencing 0% values are fed into the block). This embodiment first performs a MIN operation, outputting the lesser value of DL2 and DL5 from the MIN block, which is then fed into the MULT block where the MULT operation is performed, outputting the product of the MIN block output (either DL2 or DL5) and DL1. Since the MAX block receives a signal of 100% in its first column, then this block would output 100% and thus not alter the final output signal in this configuration. Therefore, this example embodiment essentially has an overall-minimum dimming calculation/mode (chosen from the lower output level from the 0-10V dimming interface Int2 and the DALI Int5) followed by a multiplication-based dimming calculation/mode (taking the product of the MIN result and the output level from the phase cut dimming interface Int1) to determine the final output signal. This individual switching matrix could be programmed to utilize the dimming interfaces (Int1-Int5) in any desired manner (e.g., by using a toggling sequence as previously explained, or any other suitable switching control mechanism).

If a dimming device is not connected to the driver or ballast, or the respective dimming interface is disabled, the corresponding dimming level is typically set at a default of 100%, since no dimming would be applied. For example, in the embodiment shown in FIG. 5, if no dimming device was connected to Int1, then In1 would be at a constant 100%. This would not influence the final output dimming level, since this dimming level is being fed into the MULT block. In this specific example, the driver architecture would essentially become an overall-minimum configuration where the final output dimming level is the lesser value between DL2 and DL5. In other embodiments and applications, the dimming interfaces may instead set the default dimming level at signal values less than 100% when a dimming device is not connected or the respective dimming interface is disabled.

Figure 6:
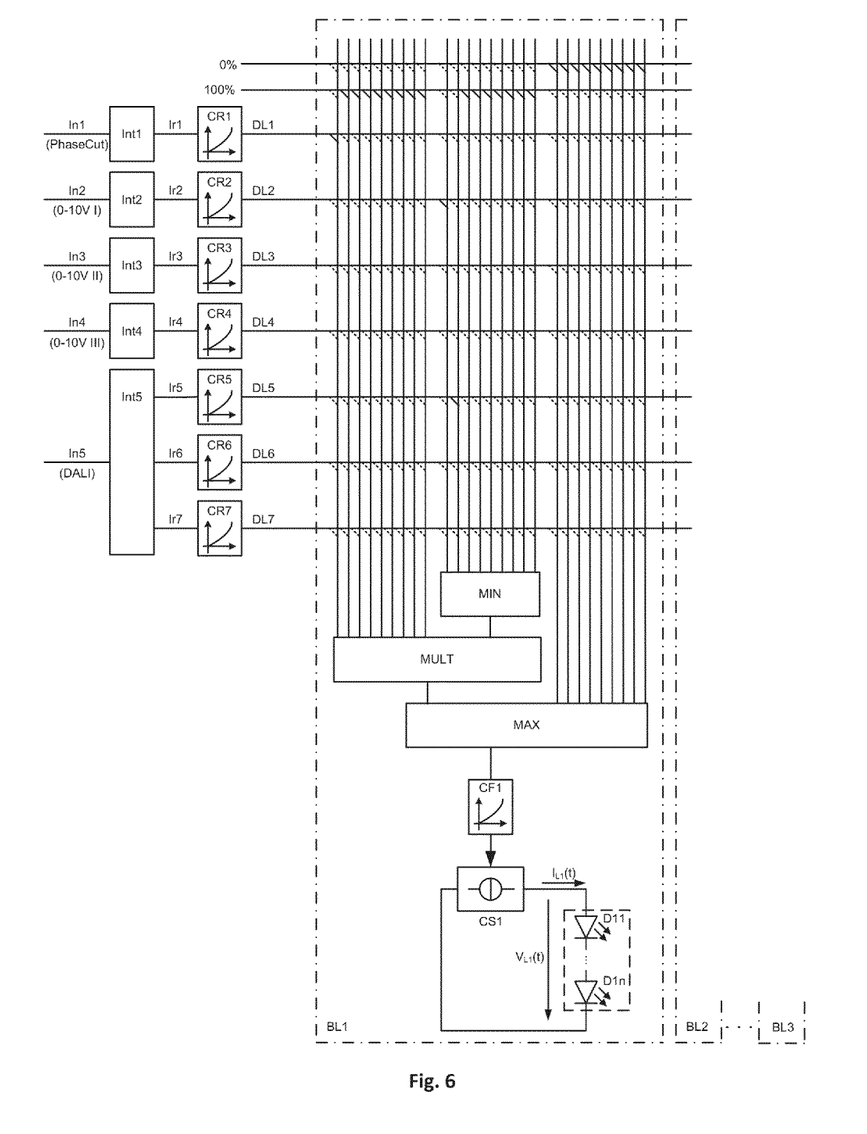
FIG. 6 is a detailed block diagram of a lighting system configured in accordance with another embodiment of the present invention.

FIG. 6 is a block diagram of a 3-channel driver having multiple dimming interfaces in accordance with another embodiment of the present invention. This embodiment is similar to that depicted in FIG. 5 and previously explained, except for changes in the programmable switching matrix. Therefore, the previous relevant discussion for the similar parts is equally applicable in this example. In more detail, and as can be seen in FIG. 6, the calculation blocks (MAX, MIN, and MULT) are in a different configuration than the embodiment shown in FIG. 5. In the embodiment of FIG. 5, the initial dimming levels (DL1-DL7) are fed through the MULT, MIN, and MAX blocks. The outputs from the MIN and MAX blocks (which can be thought of as intermediate signals) are then fed through the MULT block and the product of those signals (those selected from DL1-DL7 and/or the 0%/100% signals, MIN intermediate signal, and MAX intermediate signal) results in the final output dimming signal. In the embodiment of FIG. 6, the initial dimming levels (DL1-DL7) are also fed through the MULT, MIN, and MAX blocks. However, in this embodiment, the MIN block outputs to the MULT block, which outputs to the MAX block, as can be seen. Therefore, in the specific example shown in FIG. 6, the output of current source CS1 depends on the input signals In1, In2, and In5, as is the case in the example shown in FIG. 5. The difference, though, is that the configuration of the switching matrix shown in FIG. 6 calculates the minimum value of DL2 and DL5 and multiplies that minimum value by DL1 to obtain the current source CS1.

Figure 7:
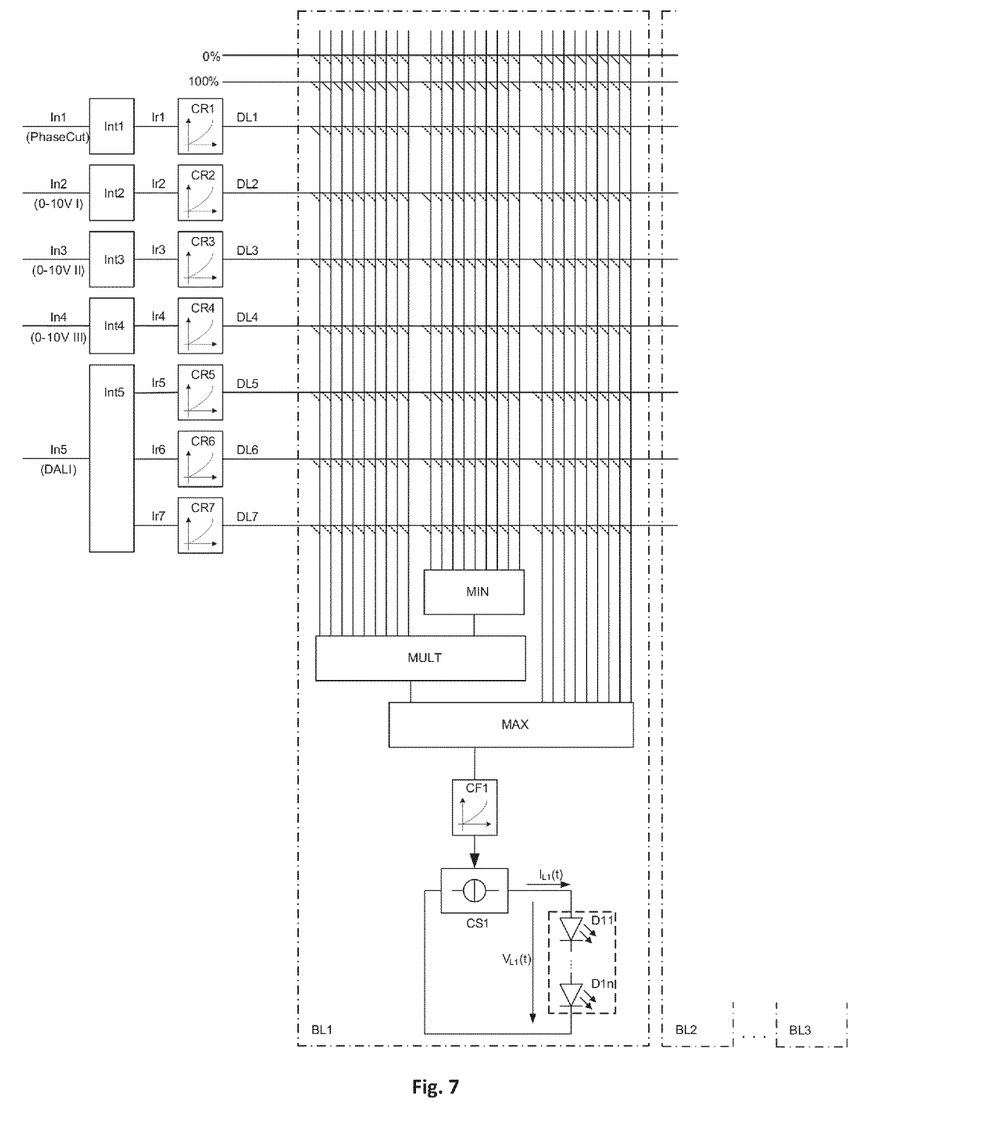
FIG. 7 is a detailed block diagram of a lighting system configured in accordance with another embodiment of the present invention.
Figure 8:
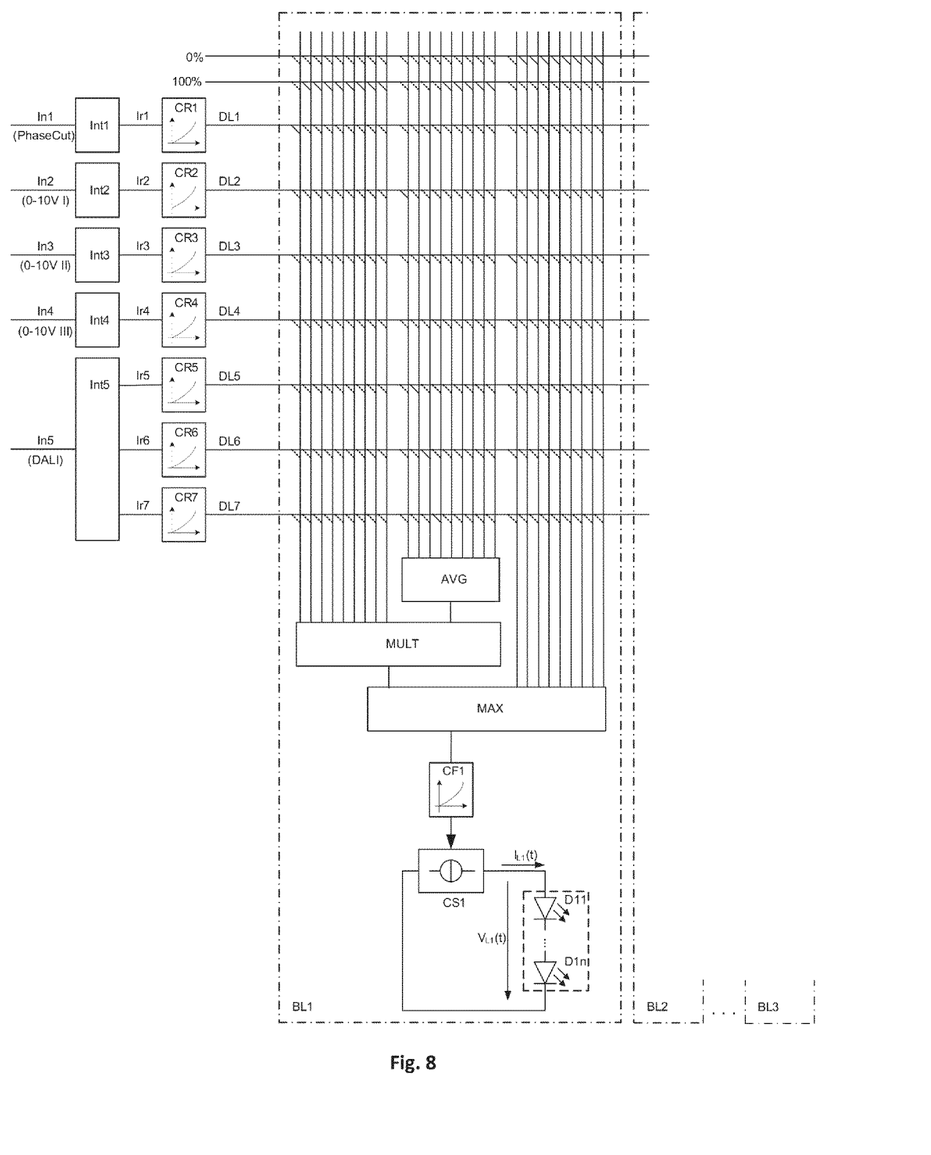
FIG. 8 is a detailed block diagram of a lighting system configured in accordance with another embodiment of the present invention.

The configuration of the example embodiment of FIG. 6 facilitates various applications. One such application makes use of this driver design by using the MAX block to produce a final override signal. FIG. 7 is a detailed block diagram of a lighting system using the same switching matrix of FIG. 6, but with a different switch configuration (i.e., different switches are opened/closed, as can be seen). The example shown in FIG. 7 can be used in the case of an emergency lighting application in a building, where one of the control inputs is mapped directly to the MAX block which is connected to a backup battery. When the power in the building drops out, the input from the backup battery is activated and at the same time, the dimming signal input to interface Int3 is changed, for example, from 0% to 60%. This means that the backup battery inputs power into the respective interface, i.e., Int3, which results in an initial dimming level DL3 of 60%. When the power goes out in this specific application, all other initial dimming signals would lose power (and thus be set at 0% in this example), except for this 60% DL3. Since the final block is a MAX block, then the final output signal would be set at that 60% level and allow the light sources (in this instance, LEDs) to be illuminated at 60% for emergency lighting. In some instances, the charge control unit of the backup battery can reduce the dimming level gradually as the state of charge of the backup battery decreases. For example, continuing with the power outage situation, the charge control unit of the backup battery can gradually reduce the dimming level from 60% down to 5% as the backup battery charge decreases from 15% down to 0%. This measure helps to extend the time emergency lighting is provided and also helps reduce the risks caused when lights suddenly turn off FIG. 8 is a block diagram of a 3-channel driver having multiple dimming interfaces in accordance with another embodiment of the present invention. This embodiment is similar to that depicted in FIGS. 5-7 and previously explained, except for changes in the programmable switching matrix. Therefore, the previous relevant discussion for the similar parts is equally applicable in this example. In more detail, and as can be seen in FIG. 8, the switching matrix uses an AVG, MULT, and MAX block. The AVG block is used to average the dimming levels it receives. In this example, the AVG block receives initial dimming levels DL2 and DL5-DL7 and produces the average of these four dimming levels. Different types of averaging methods can be used for the calculation performed by the AVG block. In some instances, the averaging method can be selected through the digital dimming interface In5 and the averaging methods may include: arithmetic mean, geometric mean, or quadratic mean (also referred to as root mean square or RMS). In the case of an arithmetic mean averaging method, the output signal of the AVG block shown in FIG. 8 can be calculated using:

$$\frac{DL2 + DL5 + DL6 + DL7}{4}.$$

In the case of a geometric mean averaging method, the output signal of the AVG block can be calculated using:

$$\sqrt[4]{DL2 * DL5 * DL6 * DL7}.$$

In the case of a quadratic mean averaging method, the output signal of the AVG block can be calculated using:

$$\frac{1}{4}\sqrt[2]{DL2^2 + DL5^2 + DL6^2 + DL7^2}.$$

These three averaging methods are provided as examples; however, other averaging methods, such as weighted averaging, may be used in other embodiments.

Continuing with the example embodiment shown in FIG. 8, the output signal of the AVG block is fed into the MULT block (with the other input signals). Next, the output signal of the MULT block is fed into the MAX block (with the other input signals) as shown. The MAX block then outputs the final dimming signal to drive the LED string at the appropriate final dimming level. A driver using an averaging calculation as previously described may be used in an application when there are several sensors installed in a space, where each sensor provides a dimming level, but only a single channel of that driver is dedicated to illuminate the space. In another application in the context of office lighting, several users may have control over the lighting level in their respective cubicles and they may also have a wall slider for dimming the general area, such that the general area is dimmed based on the average of each wall slider. In this application, there are more dimming levels generated than there are channels on the drivers.

As previously stated, any combination of calculations could be performed by the controller. In some embodiments, the controller may be implemented with hardware (e.g., gate level logic, FPGA, or ASIC) configured to manipulate the dimming levels without using any corresponding software. For example, comparators may be used to determine the overall-minimum or overall-maximum dimming value. In some embodiments, the driver may be configured to facilitate additional control of the lighting system by allowing the LED driver to enable color-changing or sequencing. This may be achieved, e.g., by dimming a mix of colored LEDs in an array to produce the desired color output. Different colored LEDs may be connected to different channels of driver embodiments having multiple channels. For example, the three-channel driver shown in FIG. 5 may have each channel connected to different colored LED arrays—e.g., red, blue, and green—to facilitate the creation of a dynamic range of colors. This could be achieved, e.g., by using a single signal from the DALI input/interface to control a single channel and thus a single color array (e.g., DL5 controls red, DL6 controls blue, and DL7 controls green). This color-changing setup may then be combined with, e.g., the phase cut dimming device connected to Int1 to provide a reduction factor that dims the overall color-changing setup.

Numerous embodiments will be apparent in light of this disclosure. One example embodiment of the present invention provides a light-emitting diode (LED) driver, including at least two dimming interfaces, wherein the interfaces each output distinct dimming signals and a controller configured to receive the dimming signals, wherein the controller manipulates the dimming signals received from the interfaces to produce a final output dimming signal to drive at least one LED. In some cases, the at least two dimming interfaces are at least one of a 0-10V interface, phase cut interface, digital addressable lighting interface (DALI), digital serial interface (DSI), digital multiplex (DMX) interface, power line communication interface, and/or wireless interface. In some other cases, the controller multiplies the dimming signals received from the dimming interfaces to produce the product of the dimming signals. In some instances, the controller compares the dimming signals received from the dimming interfaces to produce the overall minimum signal and/or the overall maximum signal. Some other instances may include at least one correction block, wherein the at least one correction block reduces distortions in at least one of the dimming signals and/or the final output dimming signal. Some cases may include at least two dimming modes, wherein each dimming mode manipulates the dimming signals in a distinct manner to produce a corresponding final output dimming signal. In some other cases, the dimming modes are end-user configurable. In some instances, the controller receives a dimming signal of 0% and a dimming signal of 100% to facilitate advanced controller manipulations. Some cases may include a programmable switching matrix that selectively feeds the dimming signals into at least one operation block to manipulate the dimming signals and produce a final output dimming signal. In other cases, the at least one operation block is one of an overall minimum block that outputs the lowest dimming signal, an overall maximum block that outputs the highest dimming signal, and/or a multiplication block that outputs the product of the dimming signals. In some instances, at least one dimming interface is selectively disabled to reduce the number of interfaces that influence the final output dimming signal.

Another example embodiment of the present invention provides a lighting control system including at least two dimming interfaces, wherein the interfaces receive inputs from dimming devices and the interfaces output dimming signals, and a controller configured to receive the dimming signals, wherein the controller multiplies the dimming signals received from the interfaces to produce a final output dimming signal that is the product of the dimming signals and can be used to drive at least one light source. In some cases, the at least one light source is at least one light-emitting diode (LED). In some other cases, the system is a ballast. In some instances, at least one dimming interface is configured to receive control signals compliant with a first standard and another dimming interface is configured to receive control signals compliant with a second standard. In some other instances, the at least two dimming interfaces are selected from a 0-10V interface, phase cut interface, digital addressable lighting interface (DALI), digital serial interface (DSI), digital multiplex (DMX) interface, power line communication interface, and/or wireless interface.

Yet another example embodiment of the present invention provides a method of dimming a light source including receiving a plurality of dimming signals into a lighting controller, manipulating at least two of the dimming signals to produce a final output dimming signal, and illuminating at least one light source using the final output dimming signal. In some cases, manipulating the at least two dimming signals includes multiplying at least two of the dimming signals to produce a final output dimming signal that is equivalent to the product of the at least two dimming signals. In some other cases, manipulating at least two of the dimming signals includes calculating the overall minimum and/or maximum dimming signal from at least one initial dimming signal to produce at least one intermediate dimming signal, and multiplying at least one initial dimming signal with the at least one intermediate dimming signal to produce a final output dimming signal. In some instances, manipulating at least two of the dimming signals includes calculating the overall minimum and/or maximum dimming signal from at least one initial dimming signal to produce a first intermediate dimming signal, multiplying at least one initial dimming signal with the first intermediate dimming signal to produce a second intermediate dimming signal, and calculating the overall maximum and/or minimum dimming signal from at least one initial dimming signal and the second intermediate dimming signal to produce a final output dimming signal. In some instances, manipulating at least two of the dimming signals includes calculating the average dimming signal from at least two initial dimming signals to produce a first intermediate dimming signal, multiplying at least one initial dimming signal with the first intermediate dimming signal to produce a second intermediate dimming signal, and calculating the overall maximum and/or minimum dimming signal from at least one initial dimming signal and the second intermediate dimming signal to produce a final output dimming signal.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A light-emitting diode (LED) driver, comprising:
at least two dimming interfaces, wherein the interfaces each output distinct dimming signals; and
a controller configured to receive the dimming signals, wherein the controller manipulates the dimming signals received from the interfaces to produce a final output dimming signal to drive at least one LED wherein the controller compares the dimming signals received from the dimming interfaces to produce the overall minimum signal and/or the overall maximum signal.

2. The LED driver of claim 1, wherein the at least two dimming interfaces are at least one of a 0-10V interface, phase cut interface, digital addressable lighting interface (DALI), digital serial interface (DSI), digital multiplex (DMX) interface, power line communication interface, and/or wireless interface.

3. The LED driver of claim 1, wherein the controller multiplies the dimming signals received from the dimming interfaces to produce the product of the dimming signals.

4. The LED driver of claim 1, further comprising at least one correction block, wherein the at least one correction block reduces distortions in at least one of the dimming signals and/or the final output dimming signal.

5. The LED driver of claim 1, further comprising at least two dimming modes, wherein each dimming mode manipulates the dimming signals in a distinct manner to produce a corresponding final output dimming signal.

6. The LED driver of claim 5, wherein the dimming modes are end-user configurable.

7. The LED driver of claim 1, wherein the controller receives a dimming signal of 0% and a dimming signal of 100% to facilitate advanced controller manipulations.

8. The LED driver of claim 7, further comprising a programmable switching matrix that selectively feeds the dimming signals into at least one operation block to manipulate the dimming signals and produce a final output dimming signal.

9. The LED driver of claim 8, wherein the at least one operation block is one of an overall minimum block that outputs the lowest dimming signal, an overall maximum block that outputs the highest dimming signal, and/or a multiplication block that outputs the product of the dimming signals.

10. The LED driver of claim 1, wherein at least one dimming interface is selectively disabled to reduce the number of interfaces that influence the final output dimming signal.

11. A lighting control system, comprising:
at least two dimming interfaces, wherein the interfaces receive inputs from dimming devices and the interfaces output dimming signals; and
a controller configured to receive the dimming signals, wherein the controller multiplies the dimming signals received from the interfaces to produce a final output dimming signal that is the product of the dimming signals and can be used to drive at least one light source, wherein the controller receives a dimming signal of 0% and a dimming signal of 100% to facilitate advanced controller manipulations.

12. The system of claim 11, wherein the at least one light source is at least one light-emitting diode (LED).

13. The system of claim 11, wherein the system is a ballast.

14. The system of claim 11, wherein at least one dimming interface is configured to receive control signals compliant with a first standard and another dimming interface is configured to receive control signals compliant with a second standard.

15. The system of claim 14, wherein the at least two dimming interfaces are selected from a 0-10V interface, phase cut interface, digital addressable lighting interface (DALI), digital serial interface (DSI), digital multiplex (DMX) interface, power line communication interface, and/or wireless interface.

16. A method of dimming a light source, comprising:
receiving a plurality of dimming signals into a lighting controller;
manipulating at least two of the dimming signals to produce a final output dimming signal wherein manipulating at least two of the dimming signals comprises:
calculating the overall minimum and/or maximum dimming signal from at least one initial dimming signal to produce at least one intermediate dimming signal; and
multiplying at least one initial dimming signal with the at least one intermediate dimming signal to produce a final output dimming signal; and
illuminating at least one light source using the final output dimming signal.

17. The method of claim 16, wherein manipulating the at least two dimming signals comprises multiplying at least two of the dimming signals to produce a final output dimming signal that is equivalent to the product of the at least two dimming signals.

18. The method of claim 16, wherein manipulating at least two of the dimming signals comprises:
- calculating the overall minimum and/or maximum dimming signal from at least one initial dimming signal to produce a first intermediate dimming signal;
- multiplying at least one initial dimming signal with the first intermediate dimming signal to produce a second intermediate dimming signal; and
- calculating the overall maximum and/or minimum dimming signal from at least one initial dimming signal and the second intermediate dimming signal to produce a final output dimming signal.

\* \* \* \* \*